(12) United States Patent
Lee et al.

(10) Patent No.: US 6,888,216 B2
(45) Date of Patent: May 3, 2005

(54) CIRCUIT HAVING MAKE-LINK TYPE FUSE AND SEMICONDUCTOR DEVICE HAVING THE SAME

(75) Inventors: Won-Seok Lee, Seoul (KR); Young-Kug Moon, Gyeonggi-do (KR); Dong-Ryul Ryu, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 306 days.

(21) Appl. No.: 10/232,338

(22) Filed: Aug. 30, 2002

(65) Prior Publication Data

US 2003/0075775 A1 Apr. 24, 2003

(30) Foreign Application Priority Data

Oct. 24, 2001 (KR) .......................................... 2001-65748

(51) Int. Cl.[7] .............................................. H01L 29/00
(52) U.S. Cl. ....................................... 257/530; 257/529
(58) Field of Search ................................. 257/379, 529, 257/530

(56) References Cited

U.S. PATENT DOCUMENTS

| | | | |
|---|---|---|---|
| 4,665,295 A | | 5/1987 | McDavid |
| 5,587,598 A | * | 12/1996 | Hatanaka ..................... 257/355 |
| 6,141,281 A | * | 10/2000 | Mobley et al. ........... 365/225.7 |
| 2002/0027248 A1 | * | 3/2002 | Aipperspach et al. ....... 257/350 |
| 2002/0044006 A1 | * | 4/2002 | Jung et al. .................. 327/525 |
| 2002/0080004 A1 | * | 6/2002 | Kimura et al. .............. 337/158 |

* cited by examiner

*Primary Examiner*—Ngân V. Ngô
(74) *Attorney, Agent, or Firm*—Marger Johnson & McCollom, P.C.

(57) ABSTRACT

The present invention discloses a circuit having a make-link type fuse. The circuit comprising a first make-link type fuse connected between a gate of a transistor and a first supply voltage.

19 Claims, 6 Drawing Sheets

CIRCUIT HAVING MAKE-LINK TYPE FUSE AND SEMICONDUCTOR DEVICE HAVING THE SAME

This application claims benefit and priority of Korean Patent Application No. 2001-65748, filed on Oct. 24, 2001, under 35 U.S.C. §119, the entirety of which is hereby incorporated by reference.

BACKGROUND OF THE INVENTION

The present invention relates to a semiconductor device, and more particularly, to a circuit having a make-link type fuse and a semiconductor device having the same.

A manufactured semiconductor device may include fuses of a break-link type or a make-link type. The break-link type fuse may include a conductive line made of a conductive material such as polysilicon. The break-link type fuse is to be electrically connected when manufactured, and is programmable for an open condition by blowing the conductive line, e.g., using a laser beam. In contrast, the make-link type fuse may include upper and lower conductive layers manufactured with an insulating layer interposed therebetween. The make-link type fuses assumes an open state condition when manufactured, and is programmable for a short circuit condition by electrically connecting the two conductive layers, e.g., using a laser beam.

During programming of a given break-link type fuse, adjacent break-link type fuses might also be affected by the laser beam that may have been used during programming. Therefore, an interval or distance between two adjacent break-link type fuses conventionally, may be kept relatively wide, which in turn may lead to a large layout area.

On the other hand, in the case of a make-link type fuse, the two conductive layers may be electrically connected by a laser beam of an energy that may seem to have a relatively low energy density in comparison to that for programming of break-type fuses. Because of the ability to use a lower energy beam during programming, a distance between the two conductive layers can be made relatively narrow, for enabling layouts with a smaller area in comparison to conventional type break-link embodiments. Make-link type fuses are described in U.S. Pat. No. 4,665,295.

However, since the electrical shorts between the two conductive layers of the make-link type fuses are formed by a laser beam, an electro-migration phenomenon may be effected even if only small currents pass through the fuse. As a result, an electrical link between the two conductive layers may eventually open.

Therefore, even though the make-link type fuse may have a small layout area, it may present a low operation reliability in comparison to the reliability of a break-link type fuse.

FIG. 1 is a circuit diagram illustrating a circuit 10 having a make-link type fuse 12 for use in a conventional semiconductor device. The circuit includes a PMOS transistor 14, a make-link type fuse 12, inverters 14 and 16, and NMOS transistors 18 and 20. Fuse 12 is coupled serially between channels of transistor 14 and the parallel combination of transistors 18, 20.

In operation a control signal CON may be generated by detecting a power-up or may be originated externally. The control signal CON may remain at a "high" level during an initial stage, and may then transition to a logic "low" level when, e.g., a power-up condition is determined, or an automatic pulse is received to trigger the event.

If make-link type fuse F1 has not been programmed for a short condition, it preserves its open state and a node 22 at the drains of NMOS transistors 18, 20 may remain in a floating state.

When the control signal CON having a logic "high" level is applied to the gate 24 of PMOS transistor 14 and gate 26 of NMOS transistor 18, the PMOS transistor 14 is turned-off, and the NMOS transistor 18 is turned-on. A signal having a logic "low" level may then bias node 22. The inverters 15,16 receive the "low" level signal and generate an output signal MS having a logic "low" level. In addition, NMOS transistor 20 is turned-on in response to a logic "high" level provided at node 28 by inverter 15. Inverter 15 and NMOS 20 may serve as a latch to maintain a logic "high" level of the node 28, and to maintain output signal MS with a "low" level via inverter 16.

When the control signal CON transitions from a logic "high" level to a logic "low" level, PMOS transistor 14 is turned-on, and NMOS transistor 18 is turned-off. The output signal MS may maintain a logic "high" level in view of the latch operation of inverter 15 and NMOS transistor 20 and given that the make-link type fuse 12 remains in its open circuit condition.

When the make-link type fuse F1 is programmed to be electrically connected, the drain of PMOS transistor 14 is electrically connected to the drain of NMOS transistor 18 via node 22.

Under these conditions, when the control signal CON assumes a logic "high" level, the PMOS transistor 14 is turned-off, and NMOS transistor 18 is turned-on. Node 22 therefore receives a logic "low" level. Inverters 15, 16 pass a logic low level for signal MS. The NMOS transistor 20 is turned-on by a high level signal of inverter 15. Inverter 15 and NMOS transistor 20 may act together as a latch to maintain node 28 with a high level and node 22 with a low level.

When control signal CON transitions from a logic "high" level to a logic "low" level, PMOS transistor 14 is turned-on, and NMOS transistor 18 is turned-off. Enabled PMOS transistor 14 attempts to charge node 22 with a logic "high" level. The latch operation of inverter 15 and NMOS transistor 20 may keep NMOS transistor 20 turned-on, and thus an electrical current may flow through make-link type fuse 12. This electrical current flowing through the make-link type fuse 12 may cause an electro-migration phenomenon within the fuse, which may result in a previously programmed link of the make-link type fuse 12 being opened.

Consequently, even though the circuit having the conventional make-link type fuse may allow a small layout area, it may suffer a low operation reliability in these applications.

For example, when the break-link type fuse for use in a redundancy circuit of, for example, a semiconductor memory device, is replaced with the make-link type fuse, an electrical current may flow through the make-link type fuse. With such currents, a link of the make-link type fuse may be opened due to the current flow and associated electro-migration.

FIG. 2 is a circuit diagram illustrating a redundancy circuit 30 having a make-link type fuse. The redundancy circuit includes NMOS transistors 34–36, make-link type fuses 38–42, NMOS transistors 44–48, an inverter 50, and OR gate 52.

Gates of NMOS transistors 44–48 receive the signal MS of input terminal 54. The drains of NMOS transistors 44–48 are connected to decoding address input terminals DA1 to DAn, respectively. The sources of the NMOS transistors 44–48 are coupled to respective fuses of the make-link type fuses 38–48. Sources of the NMOS transistors 32–36 are connected to a ground voltage, while the drains thereof are connected to the other side of respective make-link type fuse 38–42. The gates of the NMOS transistors 32–36 receive an inverted version of signal MS via inverter 50. The OR gate 52 generates, e.g., a redundancy address decoding signal PRE at output 56 by ORing signals from the drains of NMOS transistors 32–36.

An example of operation of the redundancy circuit of FIG. 2 is described below in greater detail. For example, it may be assumed that a defect occurs in a memory cell associated with a decoding address of DA1DA2 . . . DAn such as "00 . . . 1". When a redundancy enable signal MS arrives with (e.g., from a circuit such as that of FIG. 1), a logic "high" level, the redundancy address decoding signal PRE of the memory device may be generated in accordance with the programming of the make-link type fuses 38–42 of FIG. 2.

The particular decoding address DA1DA2 . . . DAn for "00 . . . 1" may be programmed within redundancy circuit 30 by connecting make-link type fuse 42 while keeping the other make-link type fuses in their open condition. Therefore, when a decoding address DA1DA2 . . . DAn of "00 . . . 1" is input, a signal having a logic "high" level may be transferred through the NMOS transistor 48. The OR gate 56 may then generate the redundancy address decoding signal PRE with a logic "high" level.

However, in the redundancy circuit of FIG. 2, in some instances when control signal MS of the control input 54 transitions from a logic "high" level to a logic "low" level, or from a logic "low" level to a logic "high" level, the NMOS transistors 32–36 may be turned-on and a DC current may flow through the link of make-link type fuse 42. Consequently, electro-migration resulting from a current flow through the fuse may cause the link to open. Because of this possibility of the make-link type fuse 42 becoming blown due to electro-migration, stable operation of the circuit cannot be assured.

In addition, drains of the other NMOS transistors, e.g., 32–34 that are connected to the rest of make-link type fuses, e.g., 38–40, except for the make-link type fuse 42, may enter a floating state. And again, stable operation may not be assured.

Therefore, due to the above-described problems, the make-link type fuses conventionally have not been used in such redundancy decoding circuits. Furthermore, because of these difficulties, the make-link type fuses conventionally have not been used in the control signal generating circuit.

SUMMARY OF THE INVENTION

An exemplary embodiment of the present invention provides for a circuit having a make-link type fuse of a high operation reliability.

In another exemplary embodiment of the present invention, a semiconductor device includes a circuit having a make-link type fuse operable in a variety of different applications.

Another embodiment of the present invention provides for a circuit having a make-link type fuse. The circuit comprises a transistor including a drain and a source. A first make-link type fuse connected between a gate of the transistor and a node to a first supply voltage.

In accordance with a further embodiment, a circuit having a make-link type fuse, may comprise a first transistor responsive to an input signal to transfer a first voltage. A second transistor responsive to the input signal to transfer a second voltage. A third transistor for may be connected between the first and second transistors and may have its gate connected to a first make-link type fuse. The opposite side of the make link type fuse may be connected to a node of a latch operable to latch a signal of a node between the second and third transistors.

In accordance with yet another embodiment of the present invention, a semiconductor device may comprise a plurality of first transistors for transferring a plurality of decoding signals in response to a control signal. A plurality of second transistors may transfer a first voltage in response to an inverted control signal. A plurality of third transistors may be connected between the plurality of the first transistors and the plurality of the second transistors, respectively. A plurality of first make-link type fuses may be connected between a second voltage node and gates of respective ones of the plurality of the third transistors.

BRIEF DESCRIPTION OF THE DRAWINGS

An understanding of the embodiments of the present invention may be obtained from the following description with reference to the accompanying drawings, in which like reference numerals may denote like parts, and in which.

DETAILED DESCRIPTION OF PREFERRED EMBODIMENTS

Reference will now be made in more detail to exemplary preferred embodiments of the present invention, example(s) of which may be illustrated in the accompanying drawings.

Figure 1:
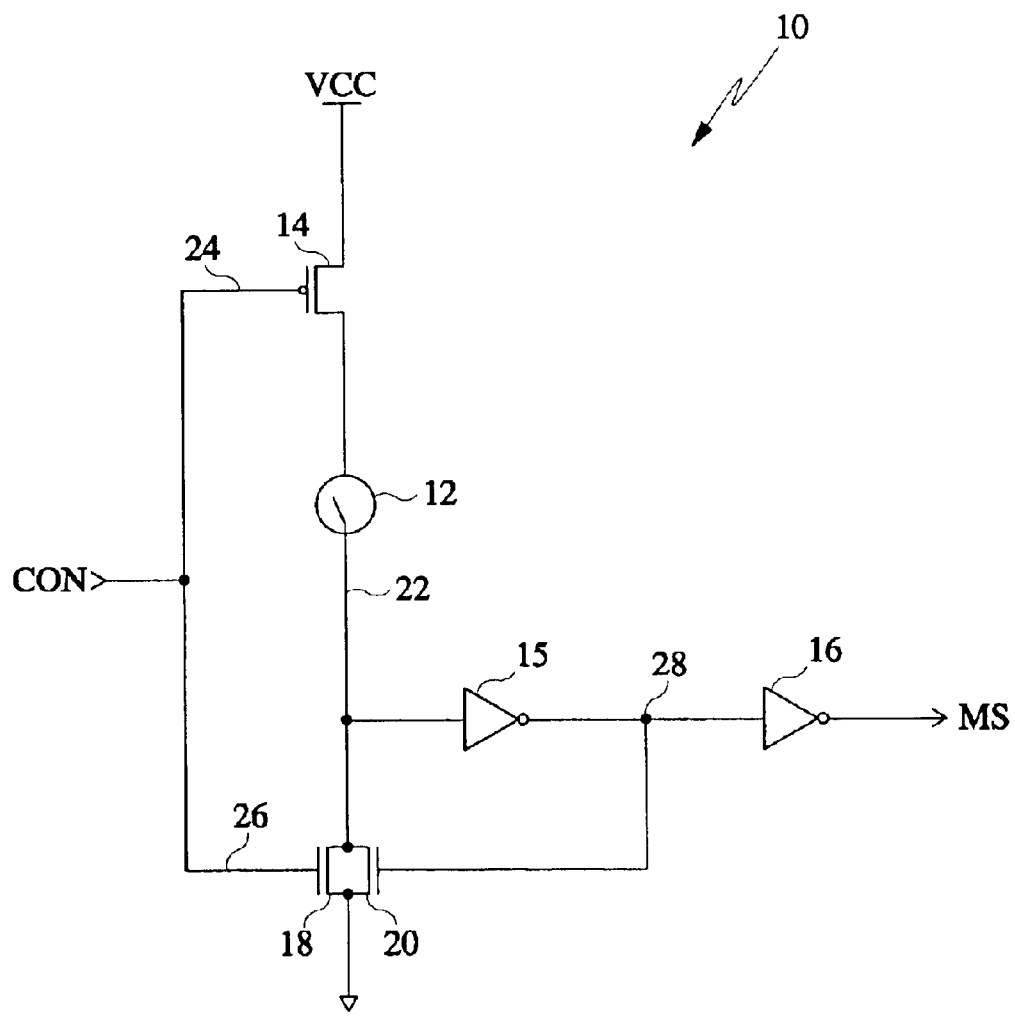
FIG. 1 is a circuit diagram illustrating a conventional circuit having a make-link type fuse.
Figure 2:
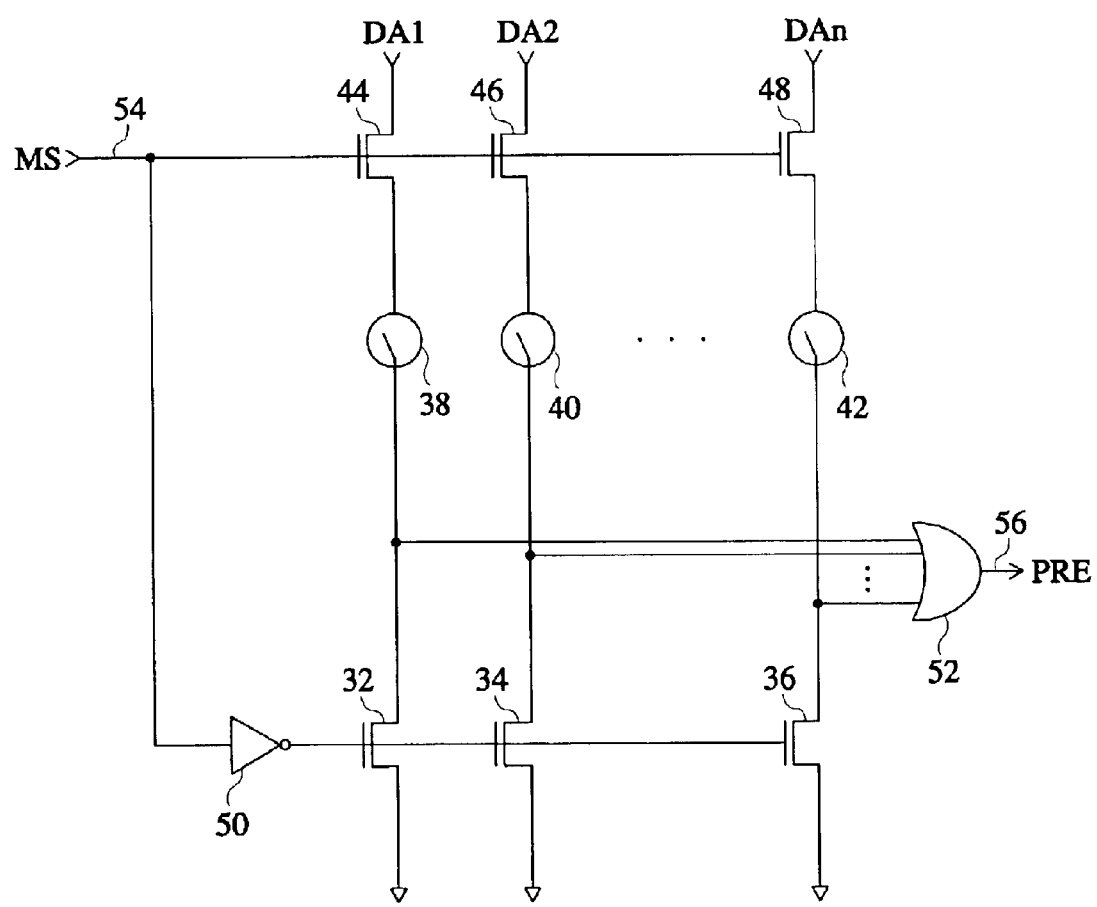
FIG. 2 is a circuit diagram illustrating a conventional redundancy circuit having make-link type fuses.
Figure 3:
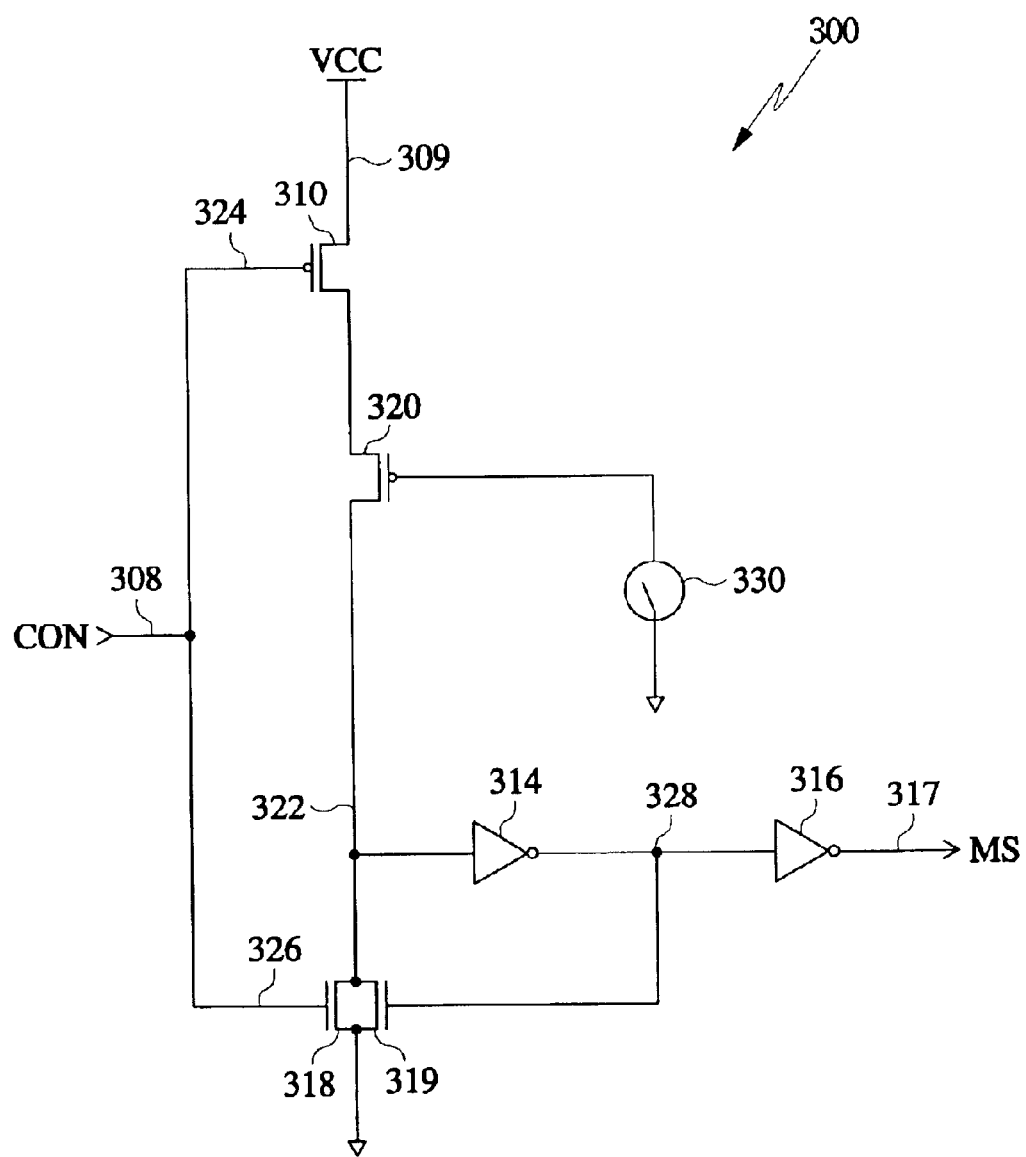
FIG. 3 is a circuit diagram illustrating a circuit having a make-link type fuse according to an embodiment of the present invention.

FIG. 3 is a circuit diagram illustrating a circuit 300 having a make-link type fuse according to an embodiment of the present invention. The circuit comprises PMOS transistors 310,320 coupled with their channels in series with a node 309 to a first supply voltage (e.g., VCC). Gate 324 of transistor 310 is coupled to input 308 to receive a control signal CON. The source of PMOS transistor 320 is coupled to the drain of PMOS transistor 310 while the drain of PMOS transistor 320 is coupled to an internal circuit node 322. A make-link type fuse 330 is electrically disposed in series between the gate of transistor 320 and a node to a second supply voltage (e.g., ground). NMOS transistors 318 and 319 are coupled with their channels in parallel and between internal circuit node 322 and a node of the second supply voltage (e.g., ground). Gate 326 of NMOS transistor 318 is coupled to the input terminal 308 to receive control signal CON. Inverters 314,316 are coupled in series between the internal circuit node 322 and output terminal 317. Inverter 314 drives gate node 328 of NMOS transistor 319. Inverter 314 and NMOS transistor 319 may be referenced together as a latch.

In operation, a control signal CON may be received at input 308 to drive gates 324,326 of PMOS transistor 310 and NMOS transistor 318, respectively. The control signal CON may be internally generated upon detecting a power-up, or it may be applied externally. The control signal CON may remain high during an initial stage, and might then transition to a logic "low" level when a power voltage is applied. Further, the control signal CON may be a pulse having a single clock cycle that is automatically generated internally when the power voltage is applied.

When make-link type fuse 330 is in its open state, it leaves the gate of PMOS transistor 320 floating. Therefore, PMOS transistor 320 may be turned-off. When input 308 receives control signal CON with a logic "high" level, NMOS transistor 318 may be turned-on and node 322 may be pulled-down to a logic "low" level. Output signal MS, therefore, may assume a logic "low" level via inverters 314,316. The logic "low" level at node 322 may cause inverter 314 to drive the gate node 328 of NMOS transistor 319 with a high level to enable the transistor and to maintain internal node 322 with the logic low level. When the control signal CON at input 308 transitions from the logic "high" level to a logic "low" level, PMOS transistor 310 may be turned-on, and NMOS transistor 318 may be turned-off. The output control signal MS, however, may remain fixed at the low level—e.g., via the latch operation of inverter 314 and NMOS transistor 319 for keeping a logic "low" level at the internal node 322.

When the make-link type fuse 330 has been programmed for a closed state, a logic "low" level may be applied to the gate of PMOS transistor 320 for turning it on. When the control signal CON comprises a logic "high" level, the PMOS transistor 310 may be turned-off and NMOS transistor 318 may be turned-on, i.e., allowing node 322 to be pulled-down to a logic "low" level.

The serially connected inverters 314,316 receive the logic "low" level of the internal circuit node 322 and drive the output terminal 317 with a control signal MS having a logic "low" level. The logic "high" level of the node 328 may be maintained by inverter 314 and NMOS transistor 319.

When control signal CON at input 308 transitions from a logic "high" level to a logic "low" level, PMOS transistor 310 is turned-on and the NMOS transistor 318 is turned-off. Since both of PMOS transistors 310 and 320 are turned-on, internal circuit node 322 may be biased (via transistors 310, 320) with the voltage of the upper supply VCC to charge node 322 with a logic "high" level. Assuming that the resistivity of NMOS transistor 319 is reasonably large (e.g., twice) that of PMOS transistors 310,320, and/or the threshold input level of inverter 314 is operative at a level, e.g., below $$V_{CC}\left[\frac{R_{Q319}}{R_{Q310} + R_{Q319} + R_{Q320}}\right],$$

then inverter 314 may receive a voltage level from internal node 322 which may be operable to toggle the output state of inverter 314, e.g., to a logic "low" level. This, in-turn, will then disable NMOS transistor 319 and establish output 317 with a control signal MS of a logic "high" level.

Since current will not flow through the make-link type fuse 330 during operation of circuit 300, the circuit may avoid problems of electro-migration within the programmed make-link type fuses.

The circuit 300 having the make-link type fuse, further referencing FIG. 3, may be configured to latch a signal of node 322 between PMOS transistor 320 and NMOS transistor 318, which may be output (via inverters 314,316) as the output signal MS. In another alternative embodiment, the circuit may be configured, to latch and output a signal of a node (e.g., node 321) between PMOS transistors 310 and 320.

It may be noted that the circuit 300 of FIG. 3 may risk abnormal operation when the make-link type fuse 330 is left in an open state and leaves the gate of PMOS transistor 320 floating.

Figure 4:
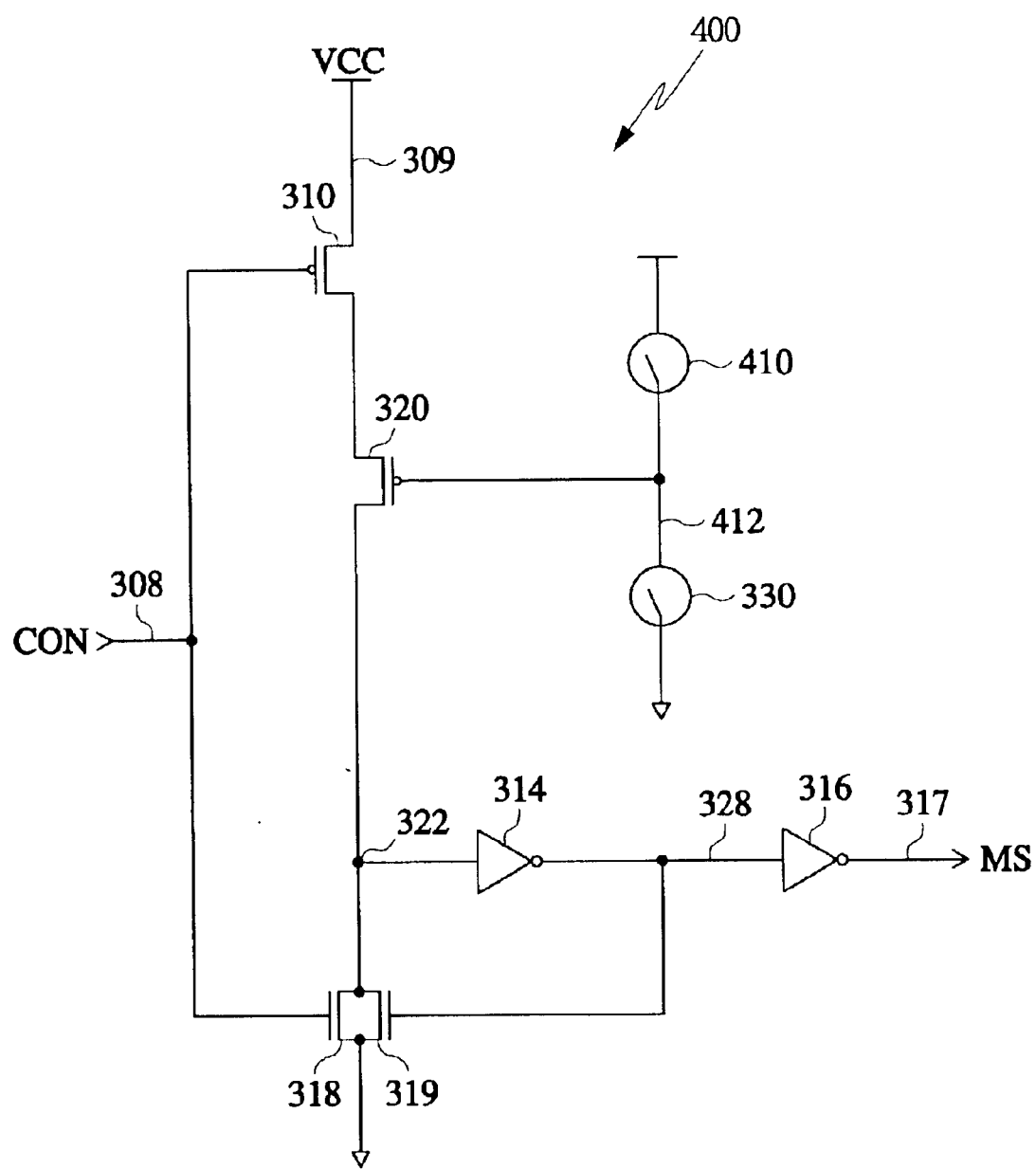
FIG. 4 is a circuit diagram illustrating a circuit having a make-link type fuse according to another embodiment of the present invention.

FIG. 4 is a circuit diagram illustrating a circuit 400 having a make-link type fuse according to another embodiment of the present invention. The circuit 400 comprises that of circuit 300 of FIG. 3, with the additional of another make-link type fuse 410. The additional make-link type fuse 410 is electrically connected between a node to a supply voltage (different from ground) and the gate node 412 of the PMOS transistor 320.

Assuming make-link type fuse 330 is in an open state, and make-link type fuse 410 has been programmed for a closed state; gate node 412 may assume a logic "high" level. PMOS transistor 320 therefore, may be turned-off. In this case, circuit 400 may operate similarly to the above-described operation of the circuit 300 of FIG. 3. But in comparison to the previously described circuit operation, in this embodiment, the gate of PMOS transistor 320 is fixed to a logic "high" level via the link of fuse 410 so that the gate is not left floating so as to assure a stable operation.

In another embodiment, the make-link type fuse 330 is programmed for a closed condition and the make-link type fuse 410 is left in an open condition. Node 412 is pulled low and PMOS transistor 320 enable. Circuit operation may, thus, be similar to that as described above with reference to the operation of circuit 300 of FIG. 3 when transistor 320 was enabled.

FIG. 4 shows a circuit configuration of a circuit with make-link type fuses which may prevent gate node 412 of PMOS transistor 320 from floating. For example, in one mode of operation, make-link type fuse 330 has been programmed for a closed state, and the gate 412 of the PMOS transistor 320 pulled-low. In another embodiment, make-link type fuse 410 is set to a closed state and fuse 330 left open, gate node 412 therefore receives a logic "high" level. Consequently, the gate of PMOS transistor 320 may be fixed to a logic "high" level or a logic "low" level dependent on the programmed states of the make-link type fuses, and thus the gate of PMOS transistor 320 may be kept from floating.

In this embodiment, the make-link type fuses 330 and 410 allow alternative supply voltage connection to the gate of PMOS transistor 320, which is connected with its channel electrically in series and between the channels of PMOS transistor 310 and the parallel combination of NMOS transistors 318, 319. Assuming only one fuse is to be programmed for a closed condition; electrical current may be kept from flowing through the make-link type fuses 330 and 410 even during operation of circuit 400.

In this embodiment, the circuit 400 of FIG. 4 may latch a signal of node 322 between PMOS transistor 320 and NMOS transistor 318, which may be output (via inverters 314,316) as output signal MS. In another embodiment, the circuit may be configured, alternatively, to latch and output the signal of node between PMOS transistors 310 and 320.

Although the circuit of FIGS. 3 and 4 were described for certain embodiments with make-link type fuses electrically connected to the gate of a PMOS transistor (e.g., transistor 320), it will be understood that the scope of the present invention encompasses other embodiments with such make-link type fuses 410 and 330 connected to the gate of an NMOS transistor (e.g., transistor of alternative doping or other similar gateable channel device).

Figure 5:
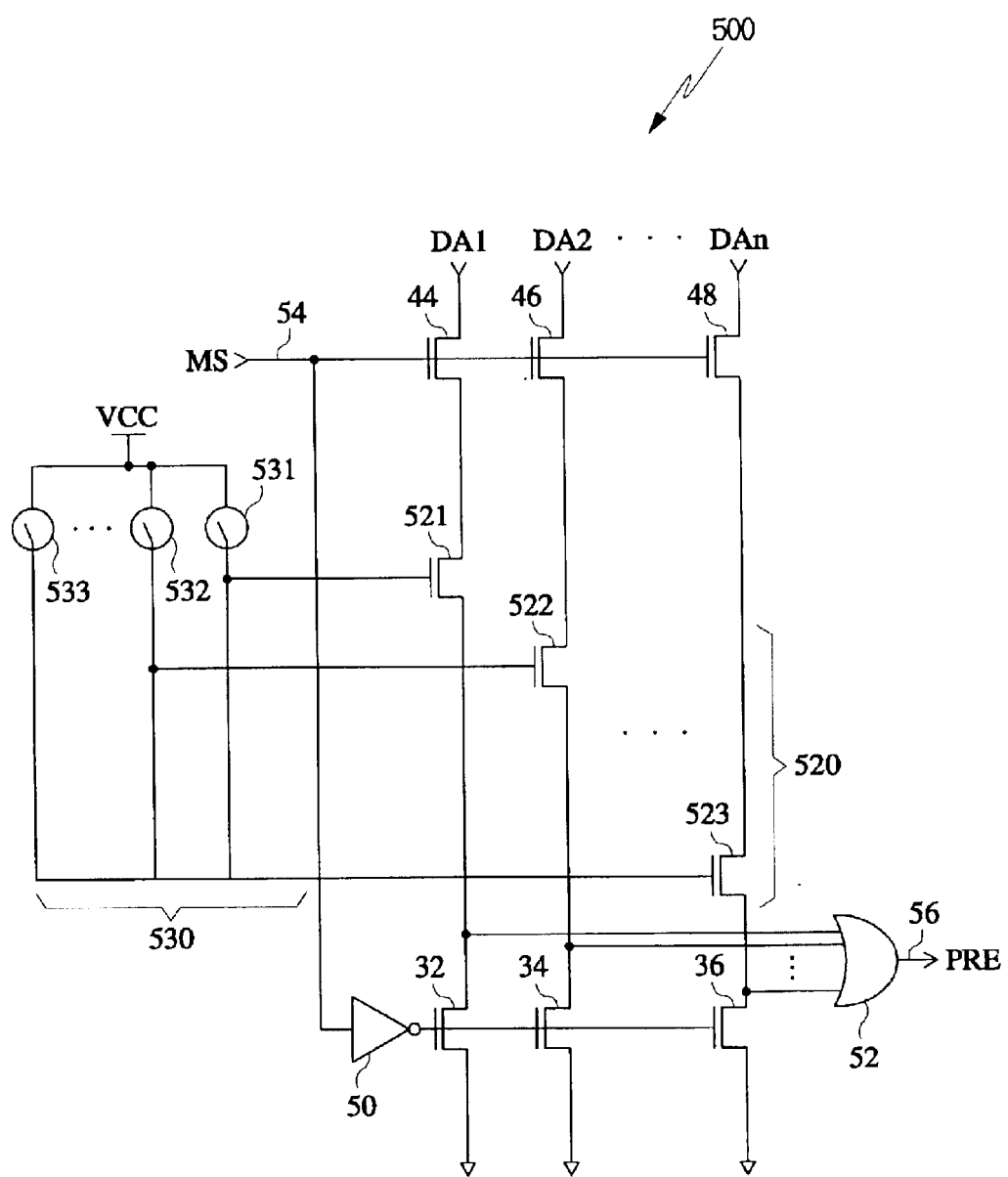
FIG. 5 is a circuit diagram illustrating a redundancy circuit having a make-link type fuse for use in a semiconductor device according to an embodiment of the present invention.

FIG. 5 is a circuit diagram illustrating an example of a redundancy circuit 500 having make-link type fuses that may be used in a semiconductor device according to an embodiment of the present invention. The redundancy circuit 500 includes NMOS transistors 44–48, 521–523 and 32–36, make-link type fuses 530, an inverter 50, and an OR gate 52.

Drains of NMOS transistors 44–48 are connected to address input terminals DA1 to DAn, respectively. Input control signal MS is applied from input 54 to the gates of NMOS transistors 44–48. Drains of the NMOS transistors 521–523 are connected to sources of respective NMOS transistors 44–48. Drains of the NMOS transistors 32–36 are connected to sources of respective NMOS transistors 521–523. The input control signal MS is applied to the gates of the NMOS transistors 32–36 via inverter 50. The sources of NMOS transistors 32–36 may be connected to a supply node, e.g., a ground voltage. The make-link type fuses 530 (e.g., 531–533) may be electrically connected in series between a node of a supply voltage VCC and the gates of respective NMOS transistors 520 (521–523). The OR gate 52 may be operable to generate a redundancy decoding signal PRE by ORing signals from the sources of NMOS transistors 521–523. The inverter 50 may be described as inverting input signal MS to generate a signal MSB for driving the gates of NMOS transistors 32–36.

In an example of an operation of redundancy circuit 500 of FIG. 5, it may be assumed that a defect occurs in a memory cell associated with a decoding address DA1DA2 . . . DAn of "e.g., 00 . . . 1". Select programming of the make-link type fuses 530 of FIG. 5 may provide activation of redundancy address decoding signal PRE when encountering the decoding address of the defective memory cell.

To establish this activation of the redundancy address decoding signal PRE when encountering the decoding address DA1DA2 . . . DAn "00 . . . 1", the make-link type fuse 523 may be programmed for a link while the remaining fuses 521–522 may be left with open states. Therefore, only the gate of NMOS transistor 523 receives the supply voltage for turning-on NMOS transistor 523. The gates of the remaining NMOS transistors may remain in a floating state.

The NMOS transistors 32–36 may be turned-off in response to inverter 50 driving them with a logic "low" level. When the decoding address DA1DA2 . . . DAn of "00 . . . 1" is input, the levels of the decoding address signal may be transferred through the NMOS transistors 44–48 and through NMOS enabled transistor 523. The OR gate 52 may, therefore, generate the redundancy address decoding signal PRE with a logic "high" level.

In this embodiment, since the make-link type fuses 530 are connected serially with the gates of respective transistors 520, current flow through the make-link type fuses may be avoided. Consequently, a linked-fuse may not subsequently blow due to an electro-migration phenomenon which might otherwise result with current flows.

With reference to the redundancy circuit 500 of FIG. 5, risk of an abnormal operation may exist since the gates of NMOS transistors 521–522 (associated with non-linked fuses of fuses 532–533) may enter a floating state.

Figure 6:
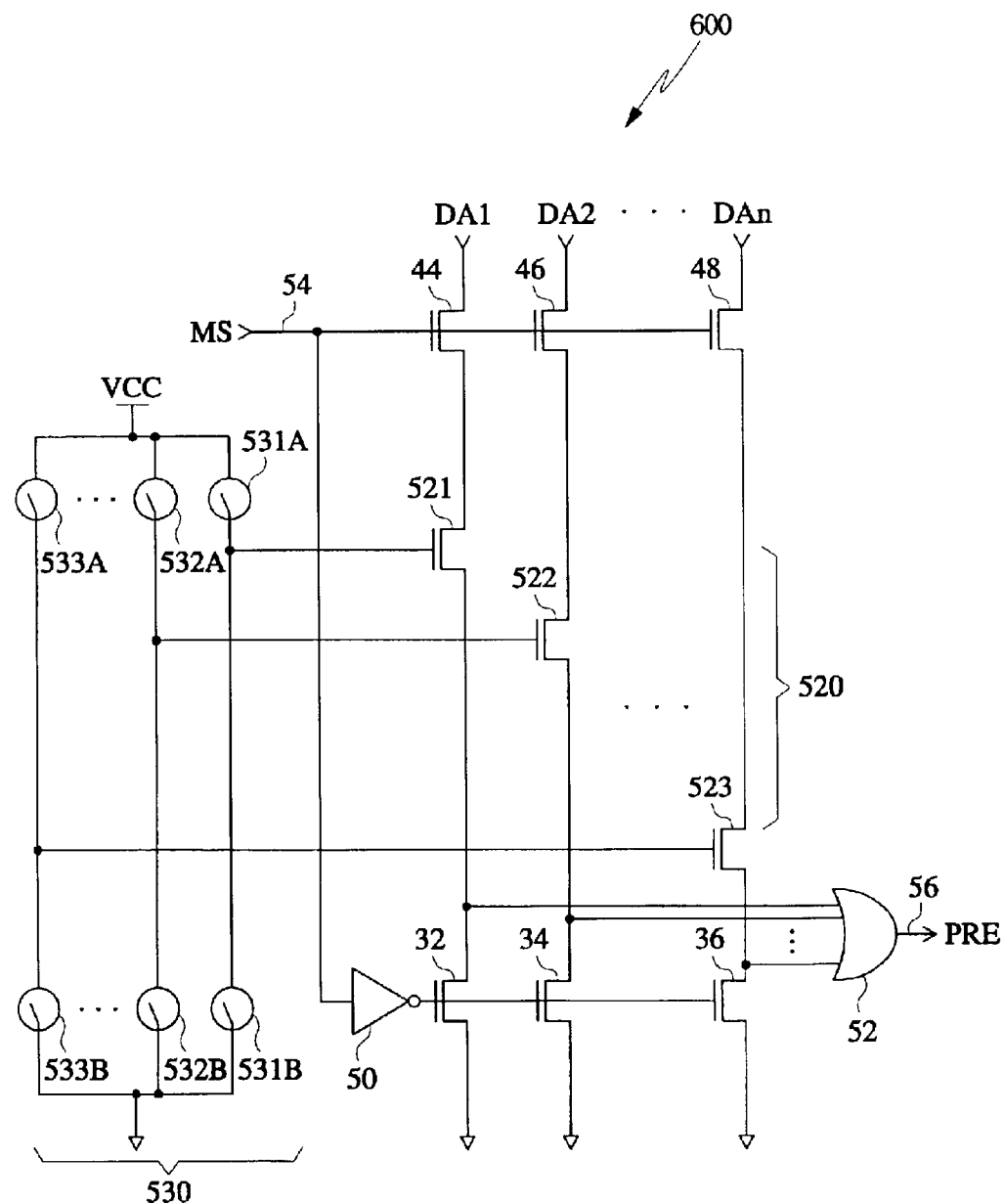
FIG. 6 is a circuit diagram illustrating a redundancy circuit having a make-link type fuse for use in a semiconductor device according to another embodiment of the present invention.

In another embodiment, with reference to FIG. 6, a redundancy circuit 600 having make-link type fuses for use in a semiconductor device may avoid risks of floating gates. The redundancy circuit 600 of FIG. 6 may be configured with make-link type fuses 531B–533B connected between ground and the gates of NMOS transistors 521–523 respectively. The remainder of the circuit may be described as similar to the circuit 500 noted above with reference to FIG. 5.

Fuses 530' may be programmed with one of the respective A–B fuse pairs set for a closed-condition (a link) and the other an open condition. With this embodiment, each of the gates of transistors 520 may be coupled to either a supply voltage (e.g., VCC) or ground. Accordingly the gates of the NMOS transistors 520 may be fixed and kept from floating, thereby helping to achieve stable circuit operation.

Again, the redundancy circuits (e.g., of FIGS. 5 and 6) in these embodiments, provide make-link type fuses 530 or 530' with connections to the gates of the NMOS transistors 520. Due to their serial connections with reference to transistor gates, a current flow through the make-link type fuses may be prevented. Consequently, a blow of a make-link type fuse (that has been previously programmed for a closed condition) can be avoided by preventing the current flow and associated electro-migration.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A circuit having a make-link type fuse, comprising:
   a transistor comprising a drain and a source; and
   a first make-link type fuse electrically connected between a gate of the transistor and a node for a first voltage.

2. The circuit of claim 1, further comprising, second make-link type fuse electrically connected between the gate of the transistor and a node for a second voltage.

3. A circuit having a make-link type fuse, comprising:
   a first transistor responsive to an input signal to transfer a first voltage;
   a second transistor responsive to the input signal to transfer a second voltage;
   a third transistor electrically disposed with its channel in series between the channels of the first and second transistors, the third transistor having a gate;
   a first make-link type fuse electrically connected between the gate of the third transistor and a node of tho second voltage; and
   a latch to latch a signal of a node electrically coupled between the second and third transistors and to generate a control signal.

4. The circuit of claim 3, further comprising second make-link type fuse electrically connected between the gate of the third transistor a node of the first voltage.

5. The circuit of claim 3, in which the node the first voltage is coupled to a power supply voltage and the node of the second voltage is coupled to a ground voltage.

6. The circuit of claim 3, in which the first and third transistors comprise PMOS transistors.

7. The circuit of claim 3, in which the second transistor is NMOS transistor.

8. The circuit of claim 3, in which the latch comprises:
   an inverter to invert a signal of the node between the second and third transistors, and
   a fourth transistor responsive to an output signal of the inverter to transfer the second voltage to the node between the second and third transistor.

9. The circuit of claim 8, in which the fourth transistor comprises an NMOS transistor.

10. A circuit having a make-link type fuse, comprising:
a first transistor to respond to an input signal to transfer a first voltage;
a second transistor to respond to the input signal to transfer a second voltage;
a third transistor comprising a gatable channel electrically in series between the channels of the first and second transistors, the third transistor further comprising gate connected to a first node;
a make-link type fuse electrically connected in series between the first node and a node for the second voltage; and
a latch to latch a signal of a node electrically between the channels of the first and second transistors for use as a control signal.

11. The circuit of claim 10, further comprising a second make-link type fuse electrically connected between the first node and a node for the first voltage.

12. The circuit of claim 10, in which the first voltage comprises a power supply voltage, and the second voltage comprises a ground.

13. The circuit of claim 10, in which the first and third transistors comprise PMOS transistors.

14. The circuit of claim 10, in which the second transistor comprises an NMOS transistor.

15. The circuit of claim 10, in which the latch comprises:
an inverter to invert a signal of the node between first and second transistors, and
a fourth transistor to respond to an output signal of the inverter to transfer a second voltage to the second node.

16. The circuit of claim 15, in which the fourth transistor comprises a PMOS transistor.

17. A semiconductor device, comprising:
a plurality of first transistors to transfer a plurality of respective a decoding signals in response to a first control signal;
a plurality of second transistors to transfer a first voltage in response to a second control signal;
a plurality of third transistors electrically connected between respective pairs of the first transistors and second transistors; and
a plurality of first make-link type fuses electrically connected between a node for a second voltage and gates of the respective third transistors of the plurality.

18. The device of claim 17, further comprising, a second plurality of make-link type fuses electrically connected between a node of the first voltage and the gates of the respective third transistors of the plurality.

19. The device of claim 17, in which the first second and third transistors comprise NMOS transistors.

* * * * *

UNITED STATES PATENT AND TRADEMARK OFFICE
CERTIFICATE OF CORRECTION

PATENT NO. : 6,888,216 B2 Page 1 of 1
APPLICATION NO. : 10/232338
DATED : May 3, 2005
INVENTOR(S) : Lee et al.

It is certified that error appears in the above-identified patent and that said Letters Patent is hereby corrected as shown below:

At column 8, line 32, please replace "comprising, second" with --comprising, a second--
At column 8, line 44, please replace "node of tho" with --node of the--
At column 8, line 50, please replace "comprising second" with --comprising a second--
At column 8, line 51, please replace "transistor a node" with --transistor and a node--
At column 8, line 53, please replace "node the" with -- node of the--
At column 8, line 57, please replace "is NMOS" with --is an NMOS--
At column9, line 8, please replace "comprising gate" with --comprising a gate--
At column 10, line 9, please replace "respective a decoding" with --respective decoding--
At column 10, line 24, please replace "the first second" with --the first, second--

Signed and Sealed this

Nineteenth Day of September, 2006

JON W. DUDAS
*Director of the United States Patent and Trademark Office*